United States Patent [19]

McIntyre

[11] Patent Number: 4,656,361

[45] Date of Patent: Apr. 7, 1987

[54] NMOS DIGITAL IMAGING CIRCUIT

[75] Inventor: Harry J. McIntyre, Los Angeles, Calif.

[73] Assignee: Xerox Corporation, Stamford, Conn.

[21] Appl. No.: 781,572

[22] Filed: Sep. 30, 1985

[51] Int. Cl.$^4$ .............................................. H04N 3/14
[52] U.S. Cl. .................................. 250/578; 358/212; 357/24
[58] Field of Search ............... 250/578; 358/212, 213; 357/24, 30, 31, 32

[56] References Cited

U.S. PATENT DOCUMENTS

| 4,112,316 | 9/1978 | Wentz | 307/304 |
| 4,363,035 | 12/1982 | Lehmann | 358/213 |
| 4,486,778 | 12/1984 | Risch et al. | 358/111 |
| 4,587,562 | 5/1986 | Imai et al. | 358/213 |

FOREIGN PATENT DOCUMENTS 0116373  9/1981  Japan .................................. 358/213

Primary Examiner—Eugene R. LaRoche
Assistant Examiner—Robert J. Pascal
Attorney, Agent, or Firm—Franklyn C. Weiss

[57] ABSTRACT

A digital imaging circuit is disclosed utilizing an indirect charge sensing technique and also sense line capacitance neutralization circuitry. A plurality of sensing cells in conjunction with odd and even digital shift registers operate to propagate the detected light signals through the imaging circuit. Each sensing cell includes a photodetector which is used to bias a transistor off to full on. The higher the amount of light impinged on said photodetector the less current said transistors will conduct. A sense line detects this decrease on current flow which allows the voltage to rise on said sense line as increasing amounts of light impinged on said photodetector.

6 Claims, 8 Drawing Figures

NMOS DIGITAL IMAGING CIRCUIT

The invention relates to an NMOS digital imaging circuit for a light sensor utilizing a technique which senses current rather than charge. Each charge packet is paired with a current whose magnitude is controlled by the size of the charge packet.

BACKGROUND OF THE INVENTION

Typical NMOS self-scan arrays use a multiplexing switch to serially address charge packets generated by their photodiodes and transfer these charge packets to the output node—a senseline. Upon the arrival of a charge packet, the senseline experiences a drop in voltage proportional to the size of the charge packet. The video signal consists of these voltage drops alternated with a recharge of the senseline to maintain a DC level. These NMOS self-scan imaging arrays are the low cost alternatives to more complex process oriented CCD imagers, but they have the following limitations:

1. Large minimum detectable light signal due to the large sense line capacitance.
2. Slow speed operation, typically 0.5 mHz data rate, due again to the large sense line capacitance.
3. Low dynamic range due to very large clock coupling to the output signal through the multiplexing switch.
4. Blooming due to light signal leakage through the multiplexing switch.

These problems are usually overcome by adding an array of dummy diodes so that noise can be differentially filtered out and by using sensitive off-chip amplifiers to read small charge packets. Although this improves the utility of self-scan arrays, these arrays have not found wide application because of the above-identified limitations.

According to the present invention, a sensor is described with a unique, indirect charge sensing scheme and a sense line capacitance neutralization circuitry. A new and unique sensing technique is disclosed which bypasses the limitations of conventional techniques by sensing current rather than charge. Each charge packet is paired with a current whose magnitude is controlled by the size of the charge packet. Although the currents are sequentially attached to the sense line via a multiplexing switch, the current passes over this node to be sent on a low capacitance node. As a result, the high capacity of the sense line is isolated from the signal detection and photogenerated charge packets are now able to be read. In addition, the currents controlled by the charge packets immediately sweep out any charge injected into the sense line by clock coupling through the multiplexing switch, thereby allowing a larger dynamic range.

DESCRIPTION OF THE DRAWINGS

For a more complete understanding of the invention, reference may be had to the following detailed description of the invention in conjunction with the drawings wherein.

DETAILED DESCRIPTION OF THE INVENTION

Figure 1:
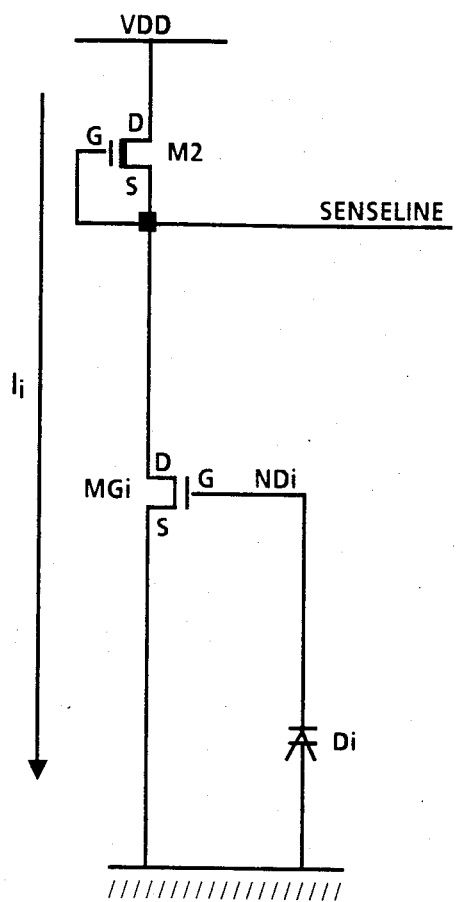
FIG. 1 is a schematic diagram of a generic sensing cell.

The self-scanning imager disclosed herein utilizes a new and unique sensing technique which bypasses the prior art limitations of conventional techniques. In this technique, current is sensed rather than charge. The path of this current is through an inverter whose driving transistor is biased by a charge packet on a photodiode. In this way, each charge packet is paired with a current and controls the magnitude of that current. This technique is implemented in the basic generic cell illustrated in FIG. 1. That is, voltage source VDD supplies a drive potential to the drain terminal of inverter transistor M2. The gate and the source terminals of depletion transistor M2 are coupled to the sense line and the input to enhancement transistor MGi. The gate of transistor MGi is coupled to the photosensitive device Di. When no light impinges upon the photosensitive device Di, transistor MGi is in saturation, (that is the resulting condition existing after the integration time, drawing current from the sense line to the system ground. However, when light impinges upon the photodetector Di, the voltage on the gate of transistor MGi decreases in accordance with the amount of light on photo device Di, which begins to bias transistor MGi, thereby limiting the current flowing through that transistor. Thus, less current flows through transistor MGi which will allow the voltage on the sense line to increase, approaching the voltage of VDD at minimum light input to the photosensitive device Di.

Figure 2:
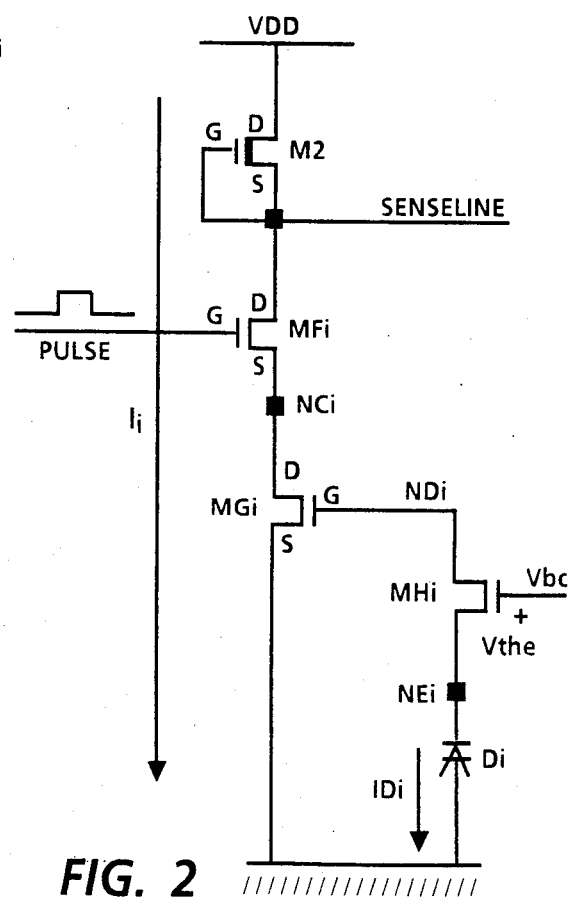
FIG. 2 is a schematic diagram of a generic sensing cell with addressing and amplification.

For addressing and amplification, respectively, transistors MFi and MHi are added, FIG. 2. Transistor MFi is a pass transistor used for sequential addressing. That is, and addressing pulse is applied to the gate of transistor MFI which turns on the circuit in FIG. 2, thereby allowing current to flow through transistor M2 and MGi. Transistor MFi, once in the on mode, is in the triode region and has negligible effect on the transfer curve of the inverter, hence node NDi's voltage determines the voltage of the sense line. Furthermore, any charge injection due to switching transistor MFi is immediately swept out to ground by the current of the inverter Ii. Transistor MHi pins the photodiode voltage to Vd=Vbc−Vthe, as long as node NDi is at greater voltage than node NEi. Hence the holes on node NDi are pulled through transistor MHi by photodiode DI's reverse current leaving a charge packet on node NDi. As node NDi has a capacitance 0.133 of node NEi, a gain of 7.5 is realized, and as transistor MGi's gate isolates the charge packet from the sense line, blooming is eliminated.

Figure 3:
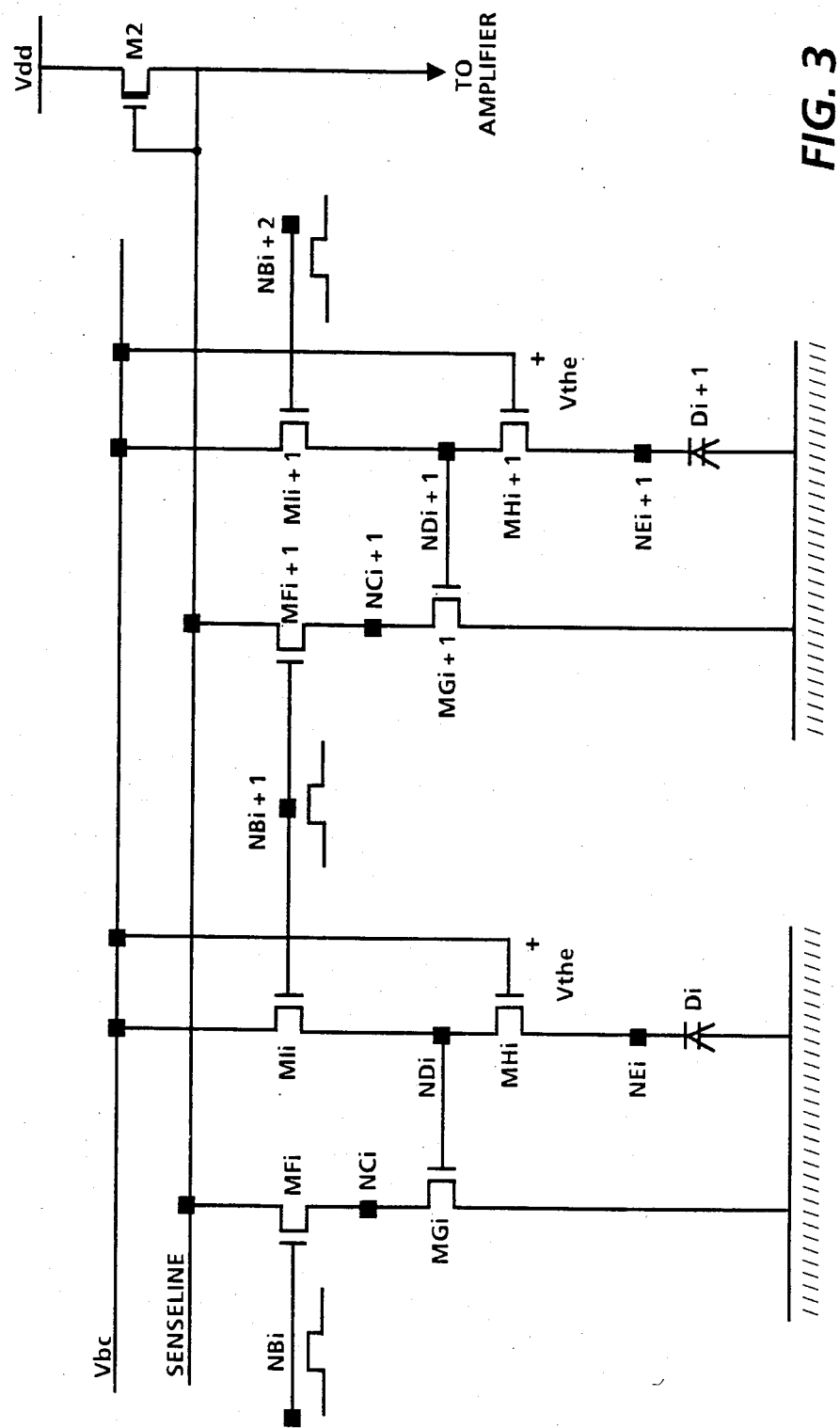
FIG. 3 is a schematic diagram of two functional sensing cells.

FIG. 2 constitutes a sensing cell which, however, lacks a recharge scheme for node NDi. In FIG. 3, transistor MIi recharges node NDi, noting that the two sensing cells share the inverter M2 transistor. When node NBi+1 receives a pulse, transistor MIi goes into the triode region and charges node NDi to the voltage Vbc.

Figure 4:
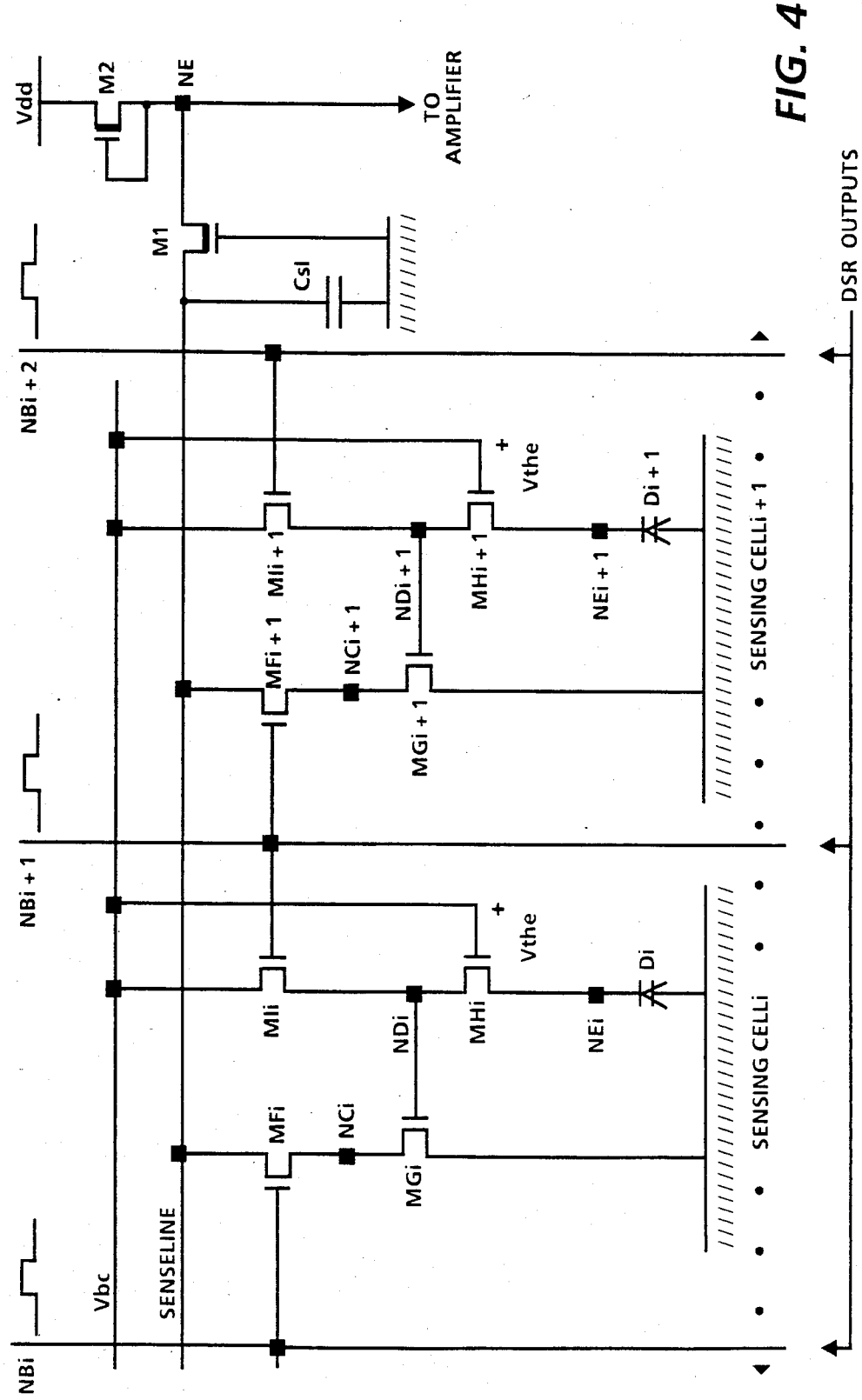
FIG. 4 is a schematic diagram of the sensing circuitry.

Putting all of the above together, an array of sensing cells, all sharing a single M2 depletion load transistor, constitutes the sensing circuit minus one transistor, M1, which is now seen in FIG. 4. The 0.8 PF capacitance of the sense line, CSL, limits the sensing array's bandwidth to only 6 MegaHz. Transistor M1, which operates in the same manner as transistor MHi, holds the sense line voltage at a DC value and passes the current to a low capacitance node, NE. The result is a gain of 6 from the sense line, to node NE, and an increase in bandwidth to 25 MegaHz.

With this sensing circuit, a video signal is generated by sequentially activating and recharging the sensing cells. The sequential addressing is accomplished by a digital shift register (DSR) whose I+1TH output node NBi+1, connects to transistors MFi+1 and MIi (in FIG. 4). A pulse sent out of cell I+1 of the DSR activates sensing cell I+1 allowing the charge packet on node NDi+1 to determine node NE's voltage, and also turns on transistor MIi to allow the recharge of node NDi. Hence, each sensing cell is first sensed and then recharged during a scan. Such addressing, done sequentially, results in a video signal on node NE.

After recharging, the time a cell waits to be activated is called the integration time. During this time, the charge packet is being integrated on node NDI by diode DI's reverse current. Thus, the size of the charge packet, and hence the signal on node NDI, is proportional to the integration time. If the sensing array is scanned too quickly, the charge packets become too small to detect. This relationship is the major factor limiting the data rate of self scan arrays. In the present design, the data rate was limited to 5 MegaHz. Despite this limitation, the bandwidth of this circuit is a vast improvement over conventional self-scan arrays.

This data rate gives an integration time of $$tint = \frac{100 \text{ sensing cells}}{\text{data rate}} = \frac{100}{5 \times 10^6} = 200 \, nS \times 100$$

$$tint = 20 \, uS$$

The maximum light generated current was calculated as shown below.

$IL = $ light intensity $m$ diode area diode response.

$$IL = 1 \frac{piu}{uM2} \times 532 \, nMZ \times 0.3 \frac{\text{Amps}}{\text{Watt}}$$

$$IL = 160 \, pA.$$

The integration time of 20 uS is long enough for the current of 160 pA to generate a charge packet of 100 fC on node NDi. The result is a 100 mV drop on voltage on node NDi. This 100 mV change is detected by the sensing cell and amplified on node NE.

Figure 5:
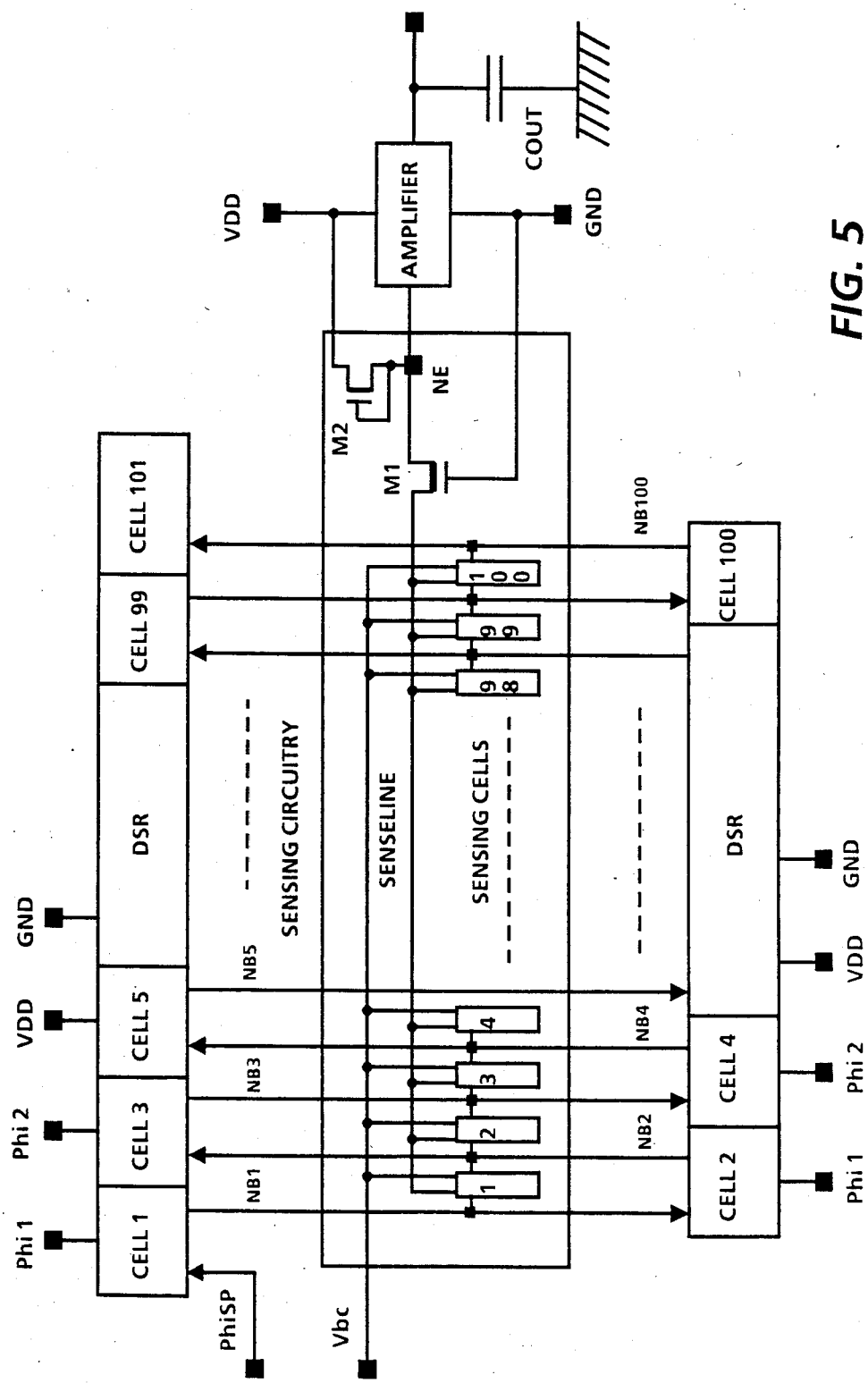
FIG. 5 is a schematic diagram of the sensor organization.

The organization of the self-scan imager sensor is shown in FIG. 5. There is a single DSR that sequentially addresses the cells of the sensing array. Its cells are arranged into an alternating pattern. The row of DSR cells above the sensing array are the odd numbered cells of the DSR. They address the odd numbered sensing cells. The row of DSR cells below the sensing array are the even numbered cells that address the even numbered sending cells. The individual light would be impinging upon individual cells 1 to 100, for example. Thus, 100 pixels, for example, would be sensed by the sensing cells and all 100 would be read out via the digital shift register. That is, the scan pulse PhiSP would be used to trigger DSR cell. This signal would then propagate down from DSR cell1 to activate sensing cell1 and continue onto DSR cell2. The signal next triggers DSR cell2 and propagates from DSR cell2 to activate sensing cell2 and continues on to DSR cell3 and so on until all of the sensing cells have been activated and all the pixels sensed. Such a pass constitutes one scan where each scan begins with activating sensing cell1 and only one scan can be occuring at any time. The resulting voltage signal appearing on the senseline is buffered by the amplifier. Lastly, note that four signals (Phi1,Phi2, Vdd and GND) are connected to each DSR cell.

Figure 6:
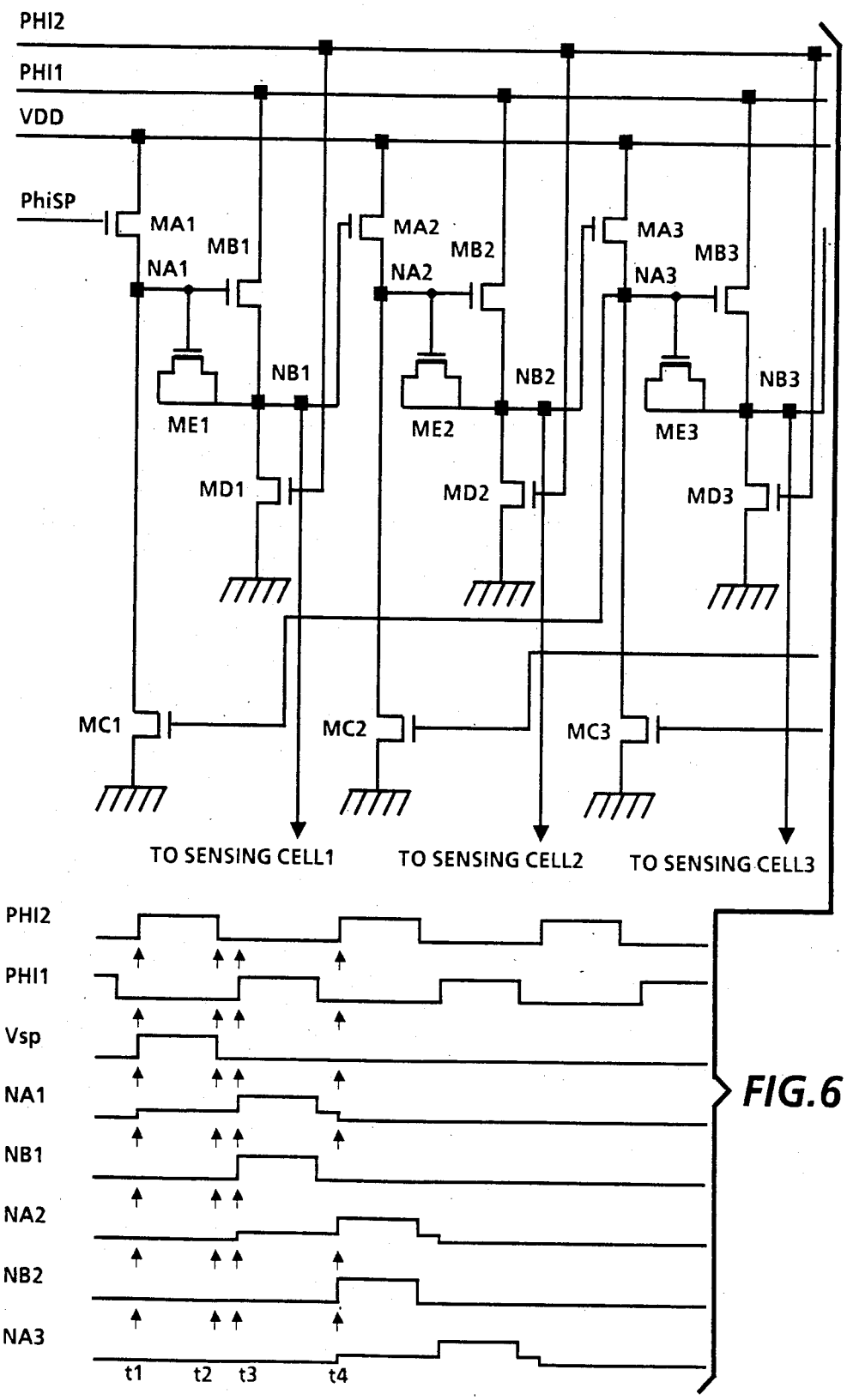
FIG. 6 is a schematic diagram of the digital shift register's first three cells and timing.

FIG. 6 shows the first DSR cells. Phi1 and Phi2 are non-overlapping two-phase, 5 volt clocks. PhiSP is a pulse that occurs at the beginning of each integration period to begin the sequential outputting of the DSR cells. At this time, t1, the capacitor ME1 gets charged to 3.8 volts and remains charged to 3.8 volts past time t2. At t3, node NB1 is bootstrapped to 7.8 volts and the full amplitude of Phi1 is passed to node NB1. Node NB1's voltage serves to activate sensing cell 1 and acts as VSP for DSR cell 2 by charging node NA2 to 3.8 volts, thus allowing the bootstrapping. As the two phase clocks go through their transitions, the VSP pulse is "passed" down the line of DSR cells. As a cell can be activated as long as its NA node is charged, this node must be discharged through transistor MDI before a second bootstrapping occurs in that DSR cell. For this purpose, MDI's gate is connected to the NAI+2 node. In FIG. 6, node NA1 gets discharged through MD1 at time t4. The DSR thus scans the sensing array.

Figure 7:
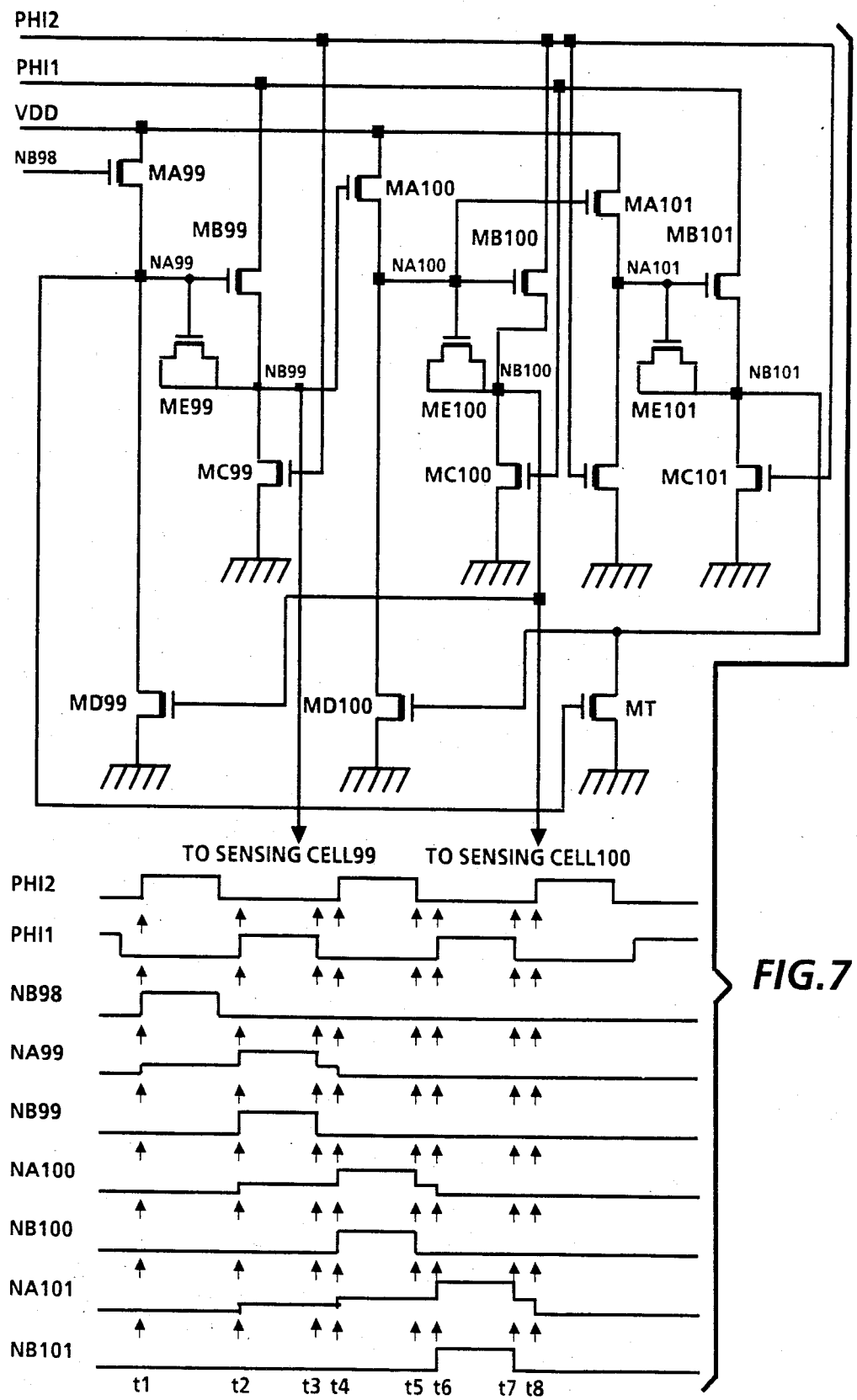
FIG. 7 is a schematic diagram of the digital shift register's termination circuitry.

However, a problem exists with the last two DSR cells. Cell 99 and cell 100 need their NA nodes discharged by cell 101 and cell 102. Cell 101 and cell 102 do not exist, hence termination circuitry for the DSR was created. This circuitry consists of an additonal DSR cell, an extra transistor, and one gate connection change to each of the last three cells. This circuitry is shown in FIG. 7. The changes are (1) transistor MT was added; (2) transistor MD99's gate was moved to MB100; (3) transistor MB100's gate was moved to node NB101; (4) transistor MB101's gate was moved to phase Phi2. Its operation is as follows:

t1—3.5 volts appears across transistor ME99
t2—node NA99 is bootstrapped to 7.8 volts
Node NB99 goes from 0 to 5 volts
Transistor ME100 gets charged to 3.8 volts
Transistor ME101 gets charged to 2.4 volts
Node NB101 is held to 0 volts by transistor MT
t3—node NB99 goes from 5 to 0 volts
Transistor ME100 retains its 3.8 volt charge
Transistor ME101 retains its 2.4 volt charge
t4—Node NA100 gets bootstrapped to 7.4 volts
Node NB100 goes from 0 to 5 volts
Node NA99 gets discharged by transistor MD99
Node NA101 gets set to 5.2 volts
Transistor ME101 gets charged to 5.2 volts
t5—Node NB100 goes from 5 to 0 volts
Transistor ME100 has a 3.8 volt charge
Transistor ME101 retains a 4.7 volt charge
t6—Node NA101 gets bootstrapped to 8.4 volts
Node NB101 goes from 0 to 5 volts
Node NA100 gets discharged by transistor MD100
t7—Node NB100 goes from 5 to 0 volts
Node NA101 goes from 8.4 to 4.7 volts t8—Node NA101 gets discharged by transistor MD101.

Thus, the digital shift register is self terminating and a VSP pulse must be supplied for each scan. This yields the ability to vary the integration time and data rate independently.

Figure 8:
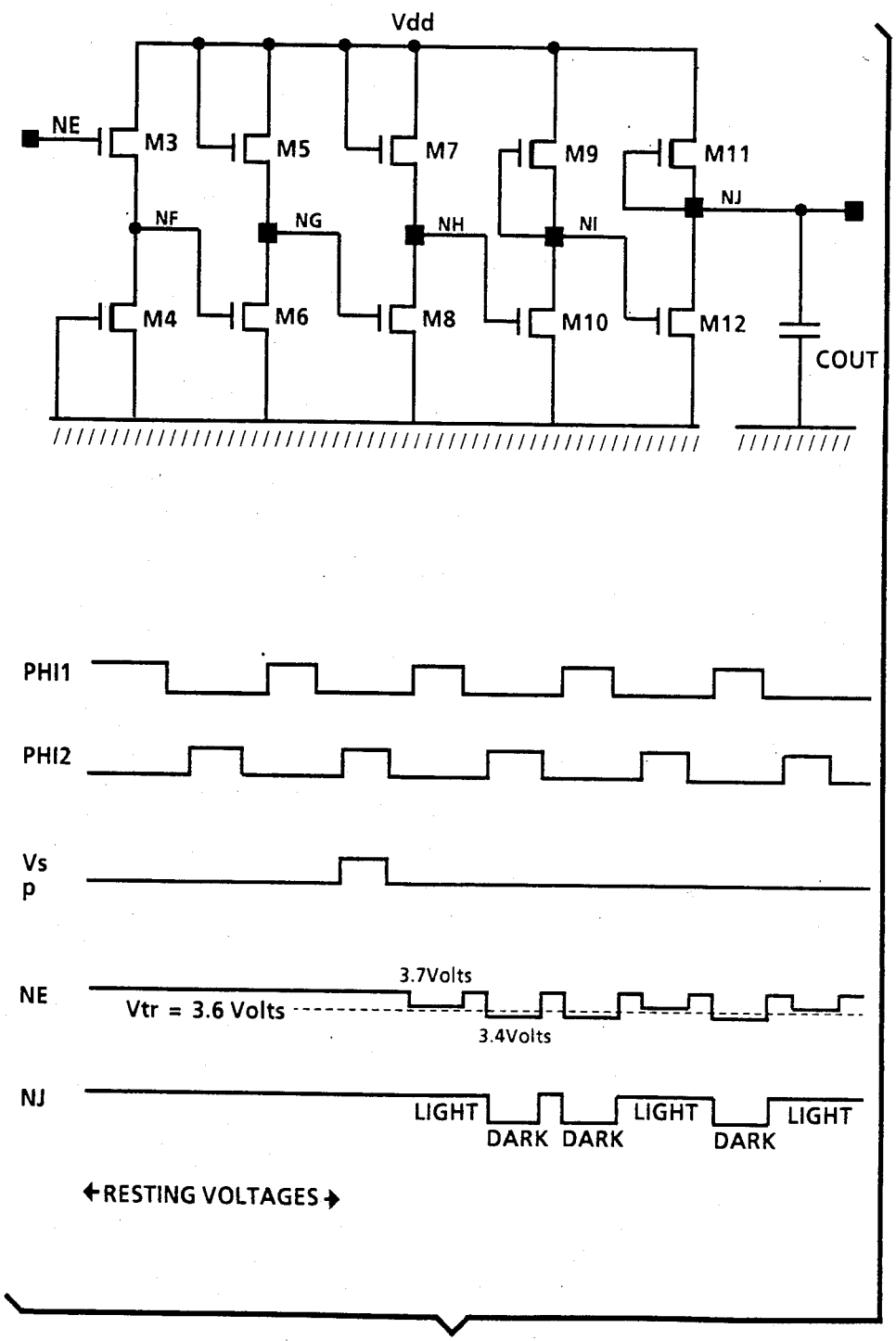
FIG. 8 is a schematic diagram of amplifier circuitry.

The output signal of the sensing circuit (Node NE) varies from 2.8 to 3.5 volts, referring to FIG. 8. This signal is level shifted to the high gain region of the amplifying stages by transistor M3 and M4. Inverters with enhancement, tie-up load transistors (M5–M8) are used to transform the signal on Node NF to a 0 to 3.5 volt digital signal. These stages are at the mid point of their transitions when Node NE is at the triggering voltage of 3.6 volts, Vtr. The inverters with tie up enhancements were chosen for (1) their wide high gain region which prevents threshold changes from moving the triggering voltage of Node NE out of the high gain region of the inverters, and (2) the insensitivity of their transfer curves to threshold voltage changes which limit the outputs triggering voltage variation to 48 mV. The last two inverters amplify the 0 to 3.5 volt signal to a 0 to 5 volt signal, and drive a 14 pF capacitance with switching times of 35 nS. The expected output signal is shown in FIG. 8. The video data is separated by spikes which reach 5 volts. These spikes occur between the activation of sensing cell as transistor M2 pulls Node NE to 5 volts whenever all sensing cells are off.

Input requirements:
VDD 5 volts DC
GND 0 volts DC
VBC 2.5 volts DC
Phi1 5 volts clock
Phi2 5 volts clock
VSP 5 volts pulse Where Phi1 and Phi2 are non-overlapping two-phase clocks; and VSP is a pulse that occurs at every 100 cycles of Phi2 and serves as the "start scanning pulse" for the digital shift register.

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. An nMOS digital imaging circuit for a light sensor wherein current is sensed rather than charge, the improvement comprising:
   a voltage supply (VDD),
   a first transistor (M2), said voltage supply coupled to the input of said transistor,
   a sense line coupled to the output of said first transistor,
   a second transistor (MGi), said sense line coupled to the input of said second transistor, and the output of said second transistor coupled to ground potential,
   photosensitive means (Di) coupled to the bias input of said second transistor and to ground potential, such that when light is impinged upon said photosensitive means the voltage upon the bias input of said second transistor decreases in accordance with the amount of light impinged on said photosensitive means, said bias operating to limit the current flowing through said second transistor to thereby allow the voltage on said sense line to increase in relation to said amount of impinged light,
   a third transistor (MFi) between said sense line and said second transistor, said third transistor responsive to an addressing pulse to allow any of said current to flow from said sense line to said second transistor, and
   a fourth transistor (MHi) between said photosensitive means and the bias input to said second transistor for amplifying the voltage generated by said photosensitive means as applied to the bias input to said second transistor, said first, second, third, and fourth transistors, and said photosensitive means comprising a sensing cell.

2. The digital imaging circuit as set forth in claim 1, further including
   a fifth transistor (MIi) between said bias input to said second transistor and a second voltage supply to supply recharge current to said fourth transistor.

3. The digital image circuit as set forth in claim 2, further including
   a sixth transistor (MI) between the senseline and said third transistor for amplifying said voltage on said senseline and for minimizing the effects of capacitance thereon.

4. The digital imaging circuit as set forth in claim 3 further including a plurality of said sensing cells in a cascade array, wherein said sixth transistor is coupled to the last of said sensing cells.

5. The digital imaging circuit as set forth in claim 4, further including
   a first digital shift register coupled to the even ones of said sensing cells to provide sequential addressing signals to said third transistor of each even sensing cell,
   a second digital shift register coupled to the odd ones of said sensing cells to provide sequential addressing signals to said third transistors of each odd sensing cell.

6. The digital imaging circuit as set forth in claim 5, further including amplifier means coupled between said first transistor and said sixth transistor to amplify the voltage signals representative of the amount of light impinged on each of said photosensitive means.

* * * * *